United States Patent
Barabash et al.

(10) Patent No.: US 9,240,236 B1
(45) Date of Patent: Jan. 19, 2016

(54) SWITCHING CONDITIONS FOR RESISTIVE RANDOM ACCESS MEMORY CELLS

(71) Applicant: Intermolecular, Inc., San Jose, CA (US)

(72) Inventors: Sergey Barabash, San Jose, CA (US); Dipankar Pramanik, Saratoga, CA (US)

(73) Assignee: Intermolecular, Inc., San Jose, CA (US)

(*) Notice: Subject to any disclaimer, the term of this patent is extended or adjusted under 35 U.S.C. 154(b) by 0 days.

(21) Appl. No.: 14/577,613

(22) Filed: Dec. 19, 2014

(51) Int. Cl.
*G11C 11/00* (2006.01)
*G11C 13/00* (2006.01)
*G11C 29/50* (2006.01)
*G11C 29/02* (2006.01)

(52) U.S. Cl.
CPC ........ *G11C 13/0097* (2013.01); *G11C 13/0011* (2013.01); *G11C 29/50* (2013.01); *G11C 29/02* (2013.01)

(58) Field of Classification Search
CPC ........... G11C 13/0004; G11C 13/0007; G11C 11/5678; G11C 29/50; G11C 29/02; G11C 13/0002; G11C 13/0009
USPC ........ 365/148, 201, 200, 163, 185.18–185.19
See application file for complete search history.

(56) References Cited

U.S. PATENT DOCUMENTS

| | | | |
|---|---|---|---|
| 7,060,586 B2 | 6/2006 | Li et al. | |
| 8,023,312 B2 | 9/2011 | Yamazaki et al. | |
| 8,410,540 B2 | 4/2013 | Araki et al. | |
| 8,711,646 B2 * | 4/2014 | Ong .................. | G11C 29/06 365/148 |
| 2005/0245039 A1 | 11/2005 | Li et al. | |
| 2006/0194403 A1 | 8/2006 | Li et al. | |
| 2009/0273964 A1 | 11/2009 | Yamazaki et al. | |

* cited by examiner

*Primary Examiner* — David Lam

(57) ABSTRACT

Provided are method for determining switching conditions for production memory cells based on dopant flux during set and reset operations. One group of test memory cells, which are representative of the production memory cells, is subjected to a prolonged application of a set voltage, while another group is subjected to a prolonged application of a reset voltage. Different durations may be used for different cells in each group. A dopant concentration profile of a test component in each cell is determined for both groups. One cell from each group may be identified such that the changes in the dopant concentration profiles in these two identified cells are complementary. The profile complementarity indicates that these two identified cells had a similar dopant flux during voltage applications. Durations of set and reset voltage applications for these two cells may be used to determine switching conditions for production memory cells.

20 Claims, 5 Drawing Sheets

Initial Forming

Operational Switching

SWITCHING CONDITIONS FOR RESISTIVE RANDOM ACCESS MEMORY CELLS

BACKGROUND

Nonvolatile memory is computer memory capable of retaining stored information even when unpowered. Nonvolatile memory is typically used for secondary storage or long-term persistent storage and may be used in addition to volatile memory, which loses the stored information when unpowered. Nonvolatile memory can be permanently integrated into computer systems (e.g., solid state hard drives) or can take the form of removable and easily transportable memory cards (e.g., USB flash drives). Nonvolatile memory is becoming more popular because of its small size/high density, low power consumption, fast read and write rates, retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in many new computer systems. However, transistor-based flash memory is often inadequate to meet the requirements for nonvolatile memory. New types of memory, such as resistive random access memory, are being developed to meet these demands and requirements.

SUMMARY

Provided are methods for determining switching conditions for production memory cells based on identifying dopant flux during set and reset operations of test cells. The term dopant as used in this disclosure includes any charged species, such as one present in small concentrations (e.g., less than 5% atomic or even less than 1% atomic). The species may be introduced in order to change crystal structure, to change crystallization temperature, to change crystallization kinetics, to passivate defects, and other like functions. One group of test memory cells, which are representative of the production memory cells, is subjected to a prolonged application of a set voltage, while another group is subjected to a prolonged application of a reset voltage. Different durations may be used for different cells in each group. The change in the dopant concentration profile of a test component in each cell is determined for both groups. One cell from each group may be identified such that the changes in the dopant concentration profiles in these two identified cells are complementary. The profile complementarity indicates that these two identified cells had a similar dopant flux during voltage applications. Durations of set and reset voltage applications for these two cells may be used to determine switching conditions for production memory cells.

In some embodiments, a method for determining switching conditions of a production memory cell involves applying a first set voltage to each test memory cell of a first plurality of test memory cells. The duration of the first set voltage is different for each test memory cell of the first plurality than any other test memory cell of the first plurality. The method also involves applying a first reset voltage to each test memory cell of a second plurality of test memory cells. The duration of the first reset voltage is different for each test memory cell of the second plurality than any other test memory cell of the second plurality. The first set voltage and first reset voltage have opposite polarities. The method proceeds with determining a dopant concentration profile of a first test component in each test memory cell of the first plurality of test memory cells and each test memory cell of the second plurality of test memory cells. The dopant concentration profiles are determined after applying the first set voltage and applying the first reset voltage. The method then proceeds with identifying a first test memory cell in the first plurality and a second test memory cell in the second plurality such that the change in the dopant concentration profile of the first test component of the first test memory cell is complementary to the change in the dopant concentration profile of the first test component of the second test memory cell. The process may also involve selecting the first duration used for the first memory cell and the second duration used for the second memory cell. For purposes of this discussion, the complementarity may be determined when two changes in dopant concentrations are substantially mirror images of each other, for example. Various comparison schemes may be used for establishing complementarity as further described below. In some embodiments, the dopant concentration profile represents a single dopant. Alternatively, the dopant concentration profile may represent multiple dopants.

In some embodiments, the production memory cell is equivalent to each test memory cell of the first plurality and of the second plurality. Specifically, the production cell may include the same components and these components may be arranged in the same manner as in each test memory cell of the first plurality and of the second plurality. For example, a set of components including the first test component and two components directly interfacing the first test component is same in the production memory cell and each test memory cell of the first plurality and second plurality. Alternatively, at least one component of the production memory cell is different than in each test memory cell of the first plurality and of the second plurality. For example, the test memory cell may be modified to eliminate or, on the other hand, improve performance of other remote components.

In some embodiments, the first test component in each test memory cell of the first plurality and second plurality is one of a current steering element, resistive switching layer, or embedded resistor. The method may be repeated for different components to find switching conditions that are acceptable for multiple components. Different severity factors may be assigned to different components depending on impact of dopant drift and diffusion in the components on the overall performance of the cell.

As described above, the first test memory cell and second memory cell exhibit complementary changes in the dopant concentration profiles. However, these cells may be subjected to their respective set voltages and reset voltages for different durations. Specifically, the first set voltage may be applied to the first test memory cell for a first duration, while the first reset voltage may be applied to the second test memory cell for a second duration. The first duration is different than the second duration. The duration may be different because of differences in absolute values of the first set voltage and first reset values and other factors. In some embodiments, the absolute value of the first set voltage is different than the absolute value of the first reset voltage.

In some embodiments, the method also involves determining a set duration for the production memory cell from a first duration used to apply the first set voltage to the first test memory cell and determining a reset duration for the production memory cell from a second duration used to apply the first reset voltage to the second test memory cell. The set duration for the production memory cell may be a fraction (e.g., a small fraction) of the first duration used to apply the first set voltage to the first test memory cell. Likewise, the reset duration for the production memory cell may be a fraction of the second duration used to apply the first reset voltage to the second test memory cell. In some embodiments, the ratio of the first duration to the set duration is between about $10^2$ and $10^6$. In the same or other embodiments, the ratio of the second duration to the reset duration is between about $10^2$ and $10^6$. The ratio of the first duration to the set duration may be substantially the same as the ratio of the second duration to the reset duration.

In some embodiments, the method also involves applying a second set voltage to each test memory cell of a third plurality of test memory cells for a first duration used to apply the first set voltage to the first test memory cell. The method also involves applying a second reset voltage to each test memory cell of a fourth plurality of test memory cells for a second duration used to apply the first reset voltage to the second test memory cell. The test may then (i.e., after applying the second set voltage to the third plurality of test memory cells and applying the second reset voltage to the fourth plurality of test memory cells) proceed with determining a dopant concentration profile of the first test component in each test memory cell of the third plurality of test memory cells and each test memory cell of the fourth plurality of test memory cells. These operations may be used to validate the durations used for the two identified cells from the first plurality and second plurality.

In some embodiments, the second set voltage is equal to the first set voltage, while the second reset voltage is equal to the first reset voltage. In other words, the same conditions are used for this repeatability test. Alternatively, one of set and rest voltage or both may be changed in this subsequent test. Specifically the second set voltage is different than the first set voltage, and the second reset voltage is different than the first reset voltage. The ratio of the second set voltage to the first set voltage may be equal to the ratio of the second reset voltage to the first reset voltage. Alternatively, the ratio of the second set voltage to the first set voltage is different than the ratio of the second reset voltage to the first reset voltage.

In some embodiments, the method also involves, after applying the first set voltage and applying the first reset voltage, determining a dopant concentration profile of a second test component in each test memory cell of the first plurality of test memory cells and each test memory cell of the second plurality of test memory cells. The method then proceeds with identifying an additional first test memory cell in the first plurality of test memory cells and an additional second test memory cell in the second plurality of test memory cells such that the changes in the dopant concentration profile of the second test component of the additional first test memory cell is complementary to the changes in the dopant concentration profile of the second test component of the additional second test memory cell.

The method may also involve applying a statistical analysis to determine a set duration for the production memory cell from a first duration used to apply the first set voltage to the first test memory cell and an additional first duration used to apply the first set voltage to the additional first test memory cell. The method may also involve applying a statistical analysis to determine a reset duration for the production memory cell from a second duration used to apply the first reset voltage to the second test memory cell and an additional second duration used to apply the first reset voltage to the additional second test memory cell.

These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings.

DETAILED DESCRIPTION

Figure 1A:
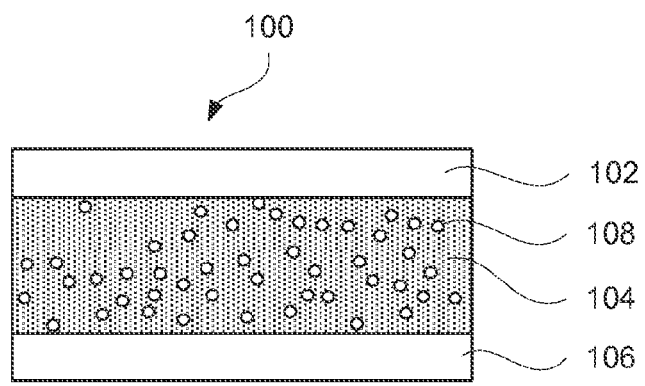
FIG. 1A illustrates a schematic representation of a ReRAM cell prior to initial forming operation, in accordance with some embodiments.

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

INTRODUCTION

A ReRAM cell exhibiting resistive switching characteristics generally includes multiple layers formed into a stack, such as a "metal-insulator-metal" (MIM) stack. The stack includes two conductive layers operating as electrodes, which are identified as "M" and may include a metal, but may also include other types of conductive materials, such as doped silicon. These conductive layers may be referred to as electrodes. The stack also includes an insulator layer provided in between the two electrodes and identified as "I". The insulator layer changes its resistive properties when certain a set voltage or a rest voltage is applied to the layer in a form of one or more pulses. Due to its variable resistance characteristics, the insulator layer may be also referred to as a variable resistance layer. These changes in resistive properties are used to store data. For example, when two different resistive states are identified (e.g., a high resistive state and a low resistive state) for a ReRAM cell, one state may be associated with a logic "zero", while the other state may be associated with a logic "one" value. Similar approaches may be used when three or more resistive states may be identified for the same ReRAM cell leading to various multibit architectures. The resistive properties (and the current data) may be monitored by applying a reading voltage, which does not change the resistive state of the insulator layer and generally has a much lower magnitude that set and reset voltages. The switching operation may involve one or more voltage pulses or, more specifically, one or more set voltage pulses or one or more reset voltage pulses. Each pulse may have a certain predetermined duration.

High voltages and currents are used for switching set and reset operations in order to rearrange materials within resistive switching layers and, in some embodiments, move materials across interfaces formed by these layers. This rearrangement helps to form and break conductive paths responsible for different resistive states of ReRAM cells as further described below with reference to FIGS. 1A-1B and FIG. 2. However, these high voltages and currents can also cause degradation of various components of ReRAM cells, in particular components having charged species, such as dopants in embedded resistors and/or current steering elements. Specifically, the high voltages and currents may cause drift and/or diffusion of the charged species resulting in an undesirable distribution and performance deterioration. For example, a current steering element may be a p-n-p diode, which may require a certain concentration of dopants in each portion of the diode.

It has been found that set and reset voltage pulses, which are used for resistive switching of bipolar cells, can be specifically selected to reduce drift and diffusion of charged species described above while maintaining operation of ReRAM cells. This drift and diffusion reduction helps to prolong the operating lifetime of the cells. In bipolar cells, a set voltage pulse and reset voltage pulse have opposite polarities and, as such, have opposite drift and diffusion effects on the charge species. This phenomenon has been relied on to determine particular set voltage pulses and reset voltage pulses such that drift and diffusion effects of these two types of pulses effectively cancel each other. However, it should be noted that multiple components of the same ReRAM cell may have charged species and these components may perform different when set voltage pulses and reset voltage pulses are applied. Furthermore, selected set voltage pulses and reset voltage pulses should also perform their primary functions, i.e., changing the resistive state of a ReRAM cell. Finally, various characteristics of a voltage pulse may be adjusted and evaluation, such as a voltage, duration, profile, and the like.

A conventional ReRAM uses the same duration for set and reset voltage pulses, e.g., 50 nanoseconds. Voltage levels used for these two pulses are usually determined experimentally to ensure resistive switching of the ReRAM cell. Often, these voltages are different resulting in more drift of charged species in one direction than another resulting in a dis-balanced system. Described methods are designed to determine durations of each of the set and reset voltage pulses such that the drift of the charge species is the same in both directions resulting in a balanced system, or more generally, that the difference between the drifts of charged species in two opposite directions is such that it substantially cancels the diffusion of the same charged species. In addition to determining the durations of each of the set and reset voltage pulses, the described methods may be used to determine voltage values used for set and reset voltage pulses, or more generally to optimize the time-voltage and the corresponding time-current profiles of set and reset pulses.

Described methods may be performed collectively or separately for different components of the same design of a ReRAM cell. For example, multiple components may have charge species. The type, concentration, and other characteristics of the charge species in one component may be different from another component resulting in different drift and/or diffusion. Furthermore, changes in performance may vary for different components as a result of the same level of drift and diffusion. Some components may be more sensitive to drift and/or diffusion than others. The drift and diffusion results for different components can be analyzed together to determine set and reset pulse parameters that have the least impact on the performance of a ReRAM cell.

A method for determining switching conditions of a production memory cell may use test memory cells that may be the same as production memory cell or have at least similar portions, such a stack including a dopant containing component and one or more surrounding components. The surrounding components may impact dopant drift and diffusion. The thickness of the dopant containing component in test cells may be the same as in production memory cells. When a production memory cell includes multiple dopant containing components, each one of these components may be tested in a separate type of test cells. Alternatively, two or more dopant containing components and, in some embodiments, all dopant containing components may be tested in the same type of test cells. When multiple types of test cells are used for testing components of the same type of production cells, the results may be aggregated using various statistical methods as further described below.

Under a typical set pulse or reset pulse, the current I(t) may be separated into one or more transient parts (i.e., $I_{tr}(t)$) and one or more steady states (i.e., $I_{st}(t, \tau)$). For simplicity, a pulse leading to one transient part and one steady state will be now explained. One having ordinary skills in the art would understand that the same concepts could be applied to a voltage case having transient parts and steady states. The transient part is identical for pulses of any duration ($\tau$) as long as these pulses have a steady state. The transient part generally depends on the design of a ReRAM cell, design or signal lines, and capabilities of devices used to apply the pulse to the ReRAM cell. The duration and the current level $I_{st}(t, \tau)$) in the steady state can be easily controlled though.

The drift and diffusion accumulate over time, and can thus be measured with accurately after long periods of time, such as after a pulse with a long steady state part. In some embodiments, the drift and diffusion of some dopant species (e.g., charged species) is negligible during the transient part of the pulse, and thus only the steady state part may need to be measured. In some embodiments, the drift and diffusion of some dopant species (e.g., charged species) follows essentially the same kinetics during the transient part of the pulse as it does during the steady state part of the pulse, so that the transient part drift and diffusion can be determined with reasonable accuracy based on detailed measurements of the steady state drift and diffusion, as long as some additional characteristics of the transient state are provided. For example, in some embodiments, the drift and diffusion rates can be first determined in the steady state for a series of the steady state current values $I_{st}$, then the actual dependence of the current $I_{tr}(t)$ during the transient part can be measured as the characteristics of the current state, and the results of these measurements can be combined by performing a numerical integration over time, assuming the instantaneous rates of drift and diffusion only depend on the instantaneous values of the current. In some embodiments, the diffusion of some dopant species (e.g., charged species) depends primarily on the current through the device. In some embodiments, the diffusion of some dopant species (e.g., charged species) depends primarily on the voltage across a part of the device, which in turn depends on the net current through the device. In some embodiments, the diffusion of some dopant species (e.g., charged species) depends primarily on both the net current and the local temperature in the device. It should be noted that the kinetics of the atomic rearrangement that leads to switching between the different resistive states may or may not change substantially between the transient part and the steady state part of the pulse, therefore it may be difficult to apply the methods described to some of the species that can be directly involved in the switching mechanism.

In some embodiments, a method for determining switching conditions of a production memory cell may involve a prolonged steady state. For example, a ratio of set operation duration used for test cells to set operation duration used for production cells may be between about $10^2$ and $10^6$. The same ratio may be used for rest operations. As such, a single test operation may represent hundreds or thousands production set operations or reset operations. Furthermore, special equipment used for production set operations or reset operations are not needed.

In some embodiments, a group of test cells is used to test different durations of steady state. Different cells may be subjected to different durations. Furthermore, at least two groups of test cells are used, one group being subjected to set voltages while the other group being subjected to reset voltages. As described elsewhere in this document, the set and reset voltages have opposite polarities, at least for bipolar memory cells. The voltage levels used for the set and reset groups of test cells may be the same or different.

It should be noted that the drift and diffusion process includes a random diffusion component and a drift component. The diffusion term describes a process wherein the individual dopant species (e.g., charged species) are thermally displaced in random directions. As a result, there is a net transfer of the dopant species from a region where the dopant species is found at a high concentration to any region where the dopant species is found in a lower concentration. The average displacement of the dopant species grows with time t as a $\sim SQRT(t)$) and does not depend on the direction of the applied current. The drift term describes a process wherein all the dopant species are displaced in the same direction by a distance that changes with the polarity of the applied field (i.e. on the polarity of the applied current) and growth with time as ($\sim E\ t$), where t presents time and E represent the applied field. Both terms include temperature pre-factors. In strong fields, the drift becomes dominant. Except for the hysteretic materials, such resistive switching layers of ReRAM cells, the applied field uniquely relates to the applied current. By rescaling the current and the temperature variation linearly in time, the drift diffusion profiles similarly rescale linearly.

After the two groups of test cells (i.e., set-group test cells and reset-group test cells) are subjected to extended durations of respective operations, the cells in each group are analyzed to determine a dopant concentration profile in at least the dopant containing components. More specifically, the test cells are analyzed to determine the average dopant drift in the direction of the applied field. This analysis may involve various destructive and/or non-destructive techniques, such as X-ray photoelectron spectroscopy (XPS), angle-resolved XPS, static secondary-ion mass spectrometry (SIMS), atom-probe tomography, and the like. In some embodiments, the average dopant drift can be determined from the concentration profile as the distance by which the positions $x_f$ of some characteristic features of the dopant concentration profile $c(x)$ shift after the application of the voltage pulse, where c represents dopant concentration, x represents the coordinate in the direction of the applied field, and $x_f$ represents the coordinate of the characteristic feature. The characteristic features of the dopant concentration profile can include the concentration maxima, $x_f=\max(c(x))$, and/or concentration minima, $x_f=\min(c(x))$, and/or the maxima of the concentration derivative $x_f=\max(|d\ c(x)/dx|)$, and/or the maxima of the concentration logarithmic derivative $x_f=\max\ (|d\ \ln\ c(x)/dx|)$. The choice of a particular characteristic feature can be made in each individual case based on the role of the particular charged species and the anticipated mechanism of device degradation.

In some embodiments, the average dopant drift is determined together with the average dopant diffusion. For example, the time dependence of the average dopant drift and/or diffusion may be determined by scaling analysis. The scaling analysis can be performed, for example, by measuring the position $x_f(t)$ of a particular feature of the concentration profile after a steady state pulse of length T and current $I_{st}$, for a series of pulse lengths T (all with the same steady state current levels $I_{st}$). The scaling analysis may also involve fitting the measured time dependence to $x_f(\tau)=A+B\ \mathrm{sqrt}(\tau)+C\tau$, where A can represent the contribution from the transient part, B can represent the diffusion term coefficient, and C can represent the drift coefficient. The average drift after time t can then be given by the product (C t). The values of A, B, and C can be determined in this manner for memory cells using different steady state current levels $I_{st}$ in both set- and reset-groups. In some embodiments, the average dopant drift can be determined by performing different scaling analysis, such as a more elaborate analysis that simultaneously considers several characteristic features of the dopant concentrations. In some embodiments, the average dopant drift can be determined by comparing the observed changes in the dopant profile $c(x, \tau)$ after the pulse of length $\tau$ to the results of numerical simulations of drift and diffusion, and varying the parameters of the numerical simulations until the simulations match the measurements.

In some embodiments, plots of average dopant drift values as a function of duration is plotted for both the set-group test cells and reset-group test cells. In some embodiments, such plots can include the time dependence of drift and/or net diffusion as determined from scaling analysis. These plots may help with identifying all pairs of duration values (one for a set operation and one for a reset operation) that have the complementary dopant drift values. It should be noted that the dopant drift values may have opposite sign for the set-group test cells and for the reset-group test cells, so that the complimentary changes in the dopant drift and diffusion may substantially cancel each other. In some embodiments, the pairs of set- and reset-duration values $T_{set}$ and $T_{reset}$, determined in this manner refer to the net duration of a large number N of pulses, such as the target number of cycles the device should sustain, and the durations of the individual pulses are then determined as $T_{set}=T_{set}/N$ and $\tau_{reset}=T_{reset}/N$. In some embodiments, the drift and diffusion that are determined by scaling analysis according to the formula $A+B\ \mathrm{sqrt}(\tau)+C\tau$ for an individual pulse, but are plotted as $NA+B\ \mathrm{sqrt}(T)+CT$, such that they may approximately account for the net drift (the CT term) and diffusion (the $B\mathrm{sqrt}(T)$ term) during the steady state parts of N pulses of length T/N each, as well as for the net drift and diffusion during the transient parts of the N pulses (the NA term). Such selected pairs or plots may be further analyzed in light or similar data for other dopant containing parameters, heating considerations, power considerations, resistive switching considerations, and other parameters. In some embodiments, such an analysis may be used to determine the cell design or cell operation specifications, other than the duration of the programming pulses and the current levels. For example, by way of illustration, the plots may reveal that the duration of the reset current that minimizes the device degradation may be excessively long for all current levels limited by the current compliance that had been selected to limit power dissipation. However, the duration may be made much shorter by increasing the current compliance, thus actually decreasing the net dissipation despite increase in peak currents. Other parameters and specifications may be similarly varied based on the trends established by the drift and diffusion analysis.

Some initial degradation of test samples may exist when compared to annealed samples. Without being restricted to any particular theory, it is believed that drifting and diffusing dopants may end up at positions different from those in a well-annealed sample even if these dopants remain inside the device. The long-term degradation from the random thermal diffusion is also not substantially modified. However, the long-term drift degradation is cancelled in the bulk and would only remain as a surface effect.

Examples of Nonvolatile ReRAM Cells and their Switching Mechanisms

A brief description of ReRAM cells is provided for context and better understanding of various features associated with embedded resistors in the ReRAM cells. As stated above, a ReRAM cell includes a dielectric material formed into a layer exhibiting resistive switching characteristics. A dielectric, which is normally insulating, can be made to conduct through one or more conductive paths formed after application of a voltage. The conductive path formation can arise from different mechanisms, including defects, metal migration, and other mechanisms further described below. Once one or more conductive paths (e.g., filaments) are formed in the dielectric component of a memory device, these conductive paths may be reset (or broken resulting in a high resistance) or set (or re-formed resulting in a lower resistance) by applying certain voltages. Without being restricted to any particular theory, it is believed that resistive switching corresponds to migration of defects within the resistive switching layer and, in some embodiments, across one interface formed by the resistive switching voltage, when a switching voltage is applied to the layer.

FIG. 1A illustrates a schematic representation of ReRAM cell 100 including first electrode 102, second electrode 106, and resistive switching layer 104 disposed in between first electrode 102 and second electrode 106. It should be noted that the "first" and "second" references for electrodes 102 and 106 are used solely for differentiation and not to imply any processing order or particular spatial orientation of these electrodes. ReRAM cell 100 may also include other components, such as an embedded resistor, diode, diffusion barrier layer, and other components. ReRAM cell 100 is sometimes referred to as a memory element or a memory unit.

First electrode 102 and second electrode 106 may be used as conductive lines within a memory array or other types of devices that ReRAM cell is integrated into. As such, electrode 102 and 106 are generally formed from conductive materials. As stated above, one of the electrodes may be reactive electrode and act as a source and as a reservoir of defects for the resistive switching layer. That is, defects may travel through an interface formed by this electrode with the resistive switching layer (i.e., the reactive interface).

Resistive switching layer 104 which may be initially formed from a dielectric material and later can be made to conduct through one or more conductive paths formed within the layer by applying first a forming voltage and then a switching voltage. To provide this resistive switching functionality, resistive switching layer 104 includes a concentration of electrically active defects 108, which may be at least partially provided into the layer during its fabrication. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types all charge carriers are referred to as defects 108.

FIG. 1A is a schematic representation of ReRAM cell 100 prior to initial formation of conductive paths, in accordance with some embodiments. Resistive switching layer 104 may include some defects 108. Additional defects 108 may be provided within first electrode 102 and may be later transferred to resistive switching layer 104 during the formation operation. In some embodiments, the resistive switching layer 104 has substantially no defects prior to forming operation and all defects are provided from first electrode 102 during forming. Second electrode 106 may or may not have any defects. It should be noted that regardless of presence or absence of defects in second electrode 106, substantially no defects are exchanged between second electrode 106 and resistive switching layer 104 during forming and/or switching operations.

Figure 1B:
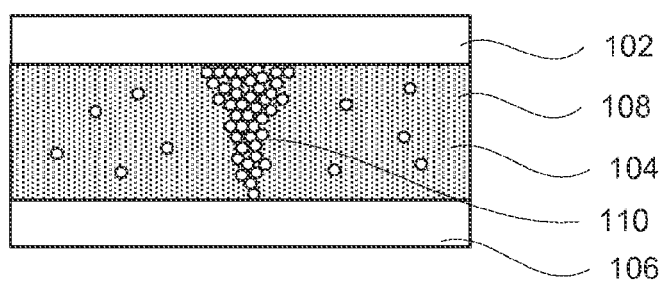
FIGS. 1B and 1C illustrate schematic representations of the ReRAM cell in its low resistive state (LRS) and high resistive state (HRS), in accordance with some embodiments.

During the forming operation, ReRAM cell 100 changes its structure from the one shown in FIG. 1A to the one shown in FIG. 1B. This change corresponds to defects 108 being arranged into one or more continuous paths within resistive switching layer 104 as, for example, schematically illustrated in FIG. 1B. Without being restricted to any particular theory, it is believed that defects 108 can be reoriented within resistive switching layer 104 to form these conductive paths as, for example, schematically shown in FIG. 1B. Furthermore, some or all defects 108 forming the conductive paths may enter resistive switching layer 104 from first electrode 102. For simplicity, all these phenomena are collectively referred to as reorientation of defects within ReRAM cell 100. This reorientation of defects 108 occurs when a certain forming voltage is applied to electrodes 102 and 106. In some embodiments, the forming operation also conducted at elevated temperatures to enhanced mobility of the defects within ReRAM cell 100. In general, the forming operation is considered to be a part of the fabrication of ReRAM cell 100, while subsequent resistive switching is considered to be a part of operation of ReRAM cell.

Figure 1C:
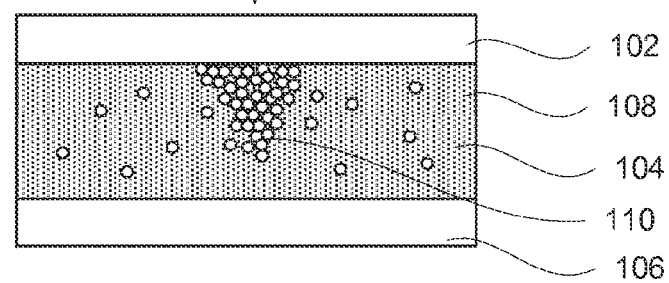

Resistive switching involves breaking and reforming conductive paths through resistive switching layer 104, i.e., switching between the state schematically illustrated in FIG. 1B and the state schematically illustrated in FIG. 1C. The resistive switching is performed by applying switching voltages to electrodes 102 and 106. Depending on magnitude and polarity of these voltages, conductive path 110 may be broken or formed back again. These voltages may be substantially lower than forming voltages (i.e., voltages used in the forming operation) since much less mobility of defects is needed during switching operations. For example, hafnium oxide based resistive layers may need about 7 Volts during their forming but can be switched using voltages less than 4 Volts.

The state of resistive switching layer 104 illustrated in FIG. 1B is referred to as a low resistance state (LRS), while the state illustrated in FIG. 1C is referred to as a high resistance state (HRS). The resistance difference between the LRS and HRS is due to different number and/or conductivity of conductive paths that exists in these states, i.e., resistive switching layer 104 has more conductive paths and/or less resistive conductive paths when it is in the LRS than when it is in the HRS. It should be noted that resistive switching layer 104 may still have some conductive paths while it is in the HRS, but these conductive paths are fewer and/or more resistive than the ones corresponding to the LRS.

When switching from its LRS to HRS, which is often referred to as a reset operation, resistive switching layer 104 may release some defects into first electrode 102. Furthermore, there may be some mobility of defects within resistive switching layer 104. This may lead to thinning and, in some embodiments, breakages of conductive paths as shown in FIG. 1C. Depending on mobility within resistive switching layer 104 and diffusion through the interface formed by resistive switching layer 104 and first electrode 102, the conductive paths may break closer to the interface with second electrode 106, somewhere within resistive switching layer 104, or at the interface with first electrode 102. This breakage generally does not correspond to complete dispersion of defects forming these conductive paths and may be a self-limiting process, i.e., the process may stop after some initial breakage occurs.

When switching from its HRS to LRS, which is often referred to as a set operation, resistive switching layer 104 may receive some defects from first electrode 102. Similar to the reset operation described above, there may be some mobility of defects within resistive switching layer 104. This may lead to thickening and, in some embodiments, reforming of conductive paths as shown in FIG. 1B. In some embodiments, a voltage applied to electrodes 102 and 106 during the set operation has the same polarity as a voltage applied during the reset operation. This type of switching is referred to as unipolar switching. Alternatively, a voltage applied to electrodes 102 and 106 during the set operation may have different polarity as a voltage applied during the reset operation. This type of switching is referred to as bipolar switching. Setting and resetting operations may be repeated multiple times as will now be described with reference to FIG. 2.

Figure 2:
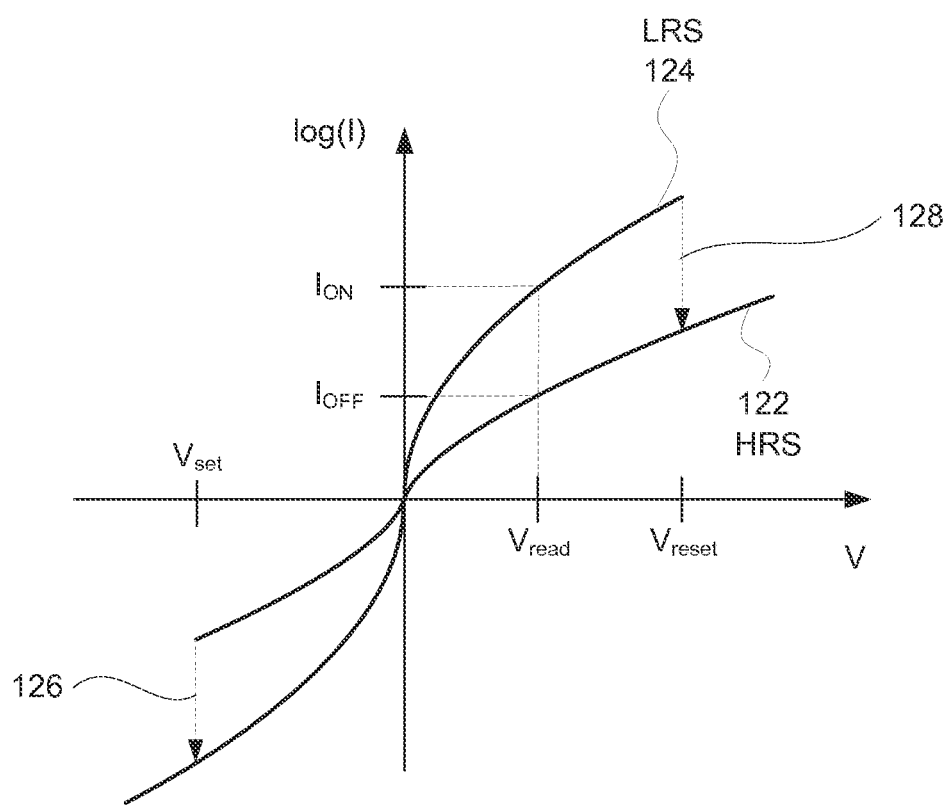
FIG. 2 illustrates a plot of a current passing through a bipolar ReRAM cell as a function of a voltage applied to the ReRAM cell, in accordance with some embodiments.

FIG. 2 illustrates the same type of a plot for a bipolar ReRAM cell, in accordance with some embodiments. The HRS is defined by line 122, while the LRS is defined by 124 in both plots. Each of these states is used to represent a different logic state, e.g., the HRS may represent logic one ("1") and LRS representing logic zero ("0") or vice versa. Therefore, each ReRAM cell that has two resistance states may be used to store one bit of data. It should be noted that some ReRAM cells may have three and even more resistance states allowing multi-bit storage in the same cell.

The overall operation of the ReRAM cell may be divided into a read operation, set operation (i.e., turning the cell "ON" by changing from its HRS to LRS), and reset operation (i.e., turning the cell "OFF" by changing from its LRS to HRS). During the read operation, the state of the ReRAM cell or, more specifically, the resistive state of its resistance of resistive switching layer can be sensed by applying a sensing voltage to its electrodes. The sensing voltage is sometimes referred to as a "READ" voltage or simply a reading voltage and indicated as $V_{READ}$ in FIG. 2. If the ReRAM cell is in its HRS (represented by line 122 in FIG. 2), the external read and write circuitry connected to the electrodes will sense the resulting "OFF" current ($I_{OFF}$) that flows through the ReRAM cell. As stated above, this read operation may be performed multiple times without changing the resistive state (i.e., switching the cell between its HRS and LRS). In the above example, the ReRAM cell should continue to output the "OFF" current ($I_{OFF}$) when the read voltage ($V_{READ}$) is applied to the electrodes for the second time, third time, and so on.

Continuing with the above example, when it is desired to turn "ON" the cell that is currently in the HRS switch, a set operation is performed. This operation may use the same read and write circuitry to apply a set voltage ($V_{SET}$) to the electrodes. Applying the set voltage forms one or more conductive paths in the resistive switching layer as described above with reference to FIGS. 1B and 1C. The switching from the HRS to LRS is indicated by dashed line 126 in FIG. 2. The resistance characteristics of the ReRAM cell in its LRS are represented by line 124. When the read voltage ($V_{READ}$) is applied to the electrodes of the cell in this state, the external read and write circuitry will sense the resulting "ON" current ($I_{ON}$) that flows through the ReRAM cell. Again, this read operation may be performed multiple times without switching the state of the ReRAM cell.

At some point, it may be desirable to turn "OFF" the ReRAM cell by changing its state from the LRS to HRS. This operation is referred to as a reset operation and should be distinguished from set operation during which the ReRAM cell is switched from its HRS to LRS. During the reset operation, a reset voltage ($V_{RESET}$) is applied to the ReRAM cell to break the previously formed conductive paths in the resistive switching layer. Switching from a LRS to HRS is indicated by dashed line 128. Detecting the state of the ReRAM cell while it is in its HRS is described above.

Overall, the ReRAM cell may be switched back and forth between its LRS and HRS many times. Read operations may be performed in each of these states (between the switching operations) one or more times or not performed at all. It should be noted that application of set and reset voltages to change resistance states of the ReRAM cell involves complex mechanisms that are believed to involve localized resistive heating as well as mobility of defects impacted by both temperature and applied potential.

In some embodiments, the set voltage ($V_{SET}$) is between about 100 mV and 10V or, more specifically, between about 500 mV and 5V. The length of set voltage pulses ($t_{SET}$) may be less than about 100 milliseconds or, more specifically, less than about 5 milliseconds and even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1 mA or, more specifically, is greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$). ReRAM cells should be able to cycle between LRS and HRS between at least about $10^3$ times or, more specifically, at least about $10^7$ times without failure. A data retention time ($t_{RET}$) should be at least about 5 years or, more specifically, at least about 10 years at a thermal stress up to 85° C. and small electrical stress, such as a constant application of the read voltage ($V_{READ}$). Other considerations may include low current leakage, such as less than about 40 A/cm² measured at 0.5 V per 20 Å of oxide thickness in HRS.

Examples of Method for Determining Switching Conditions

Figure 3:
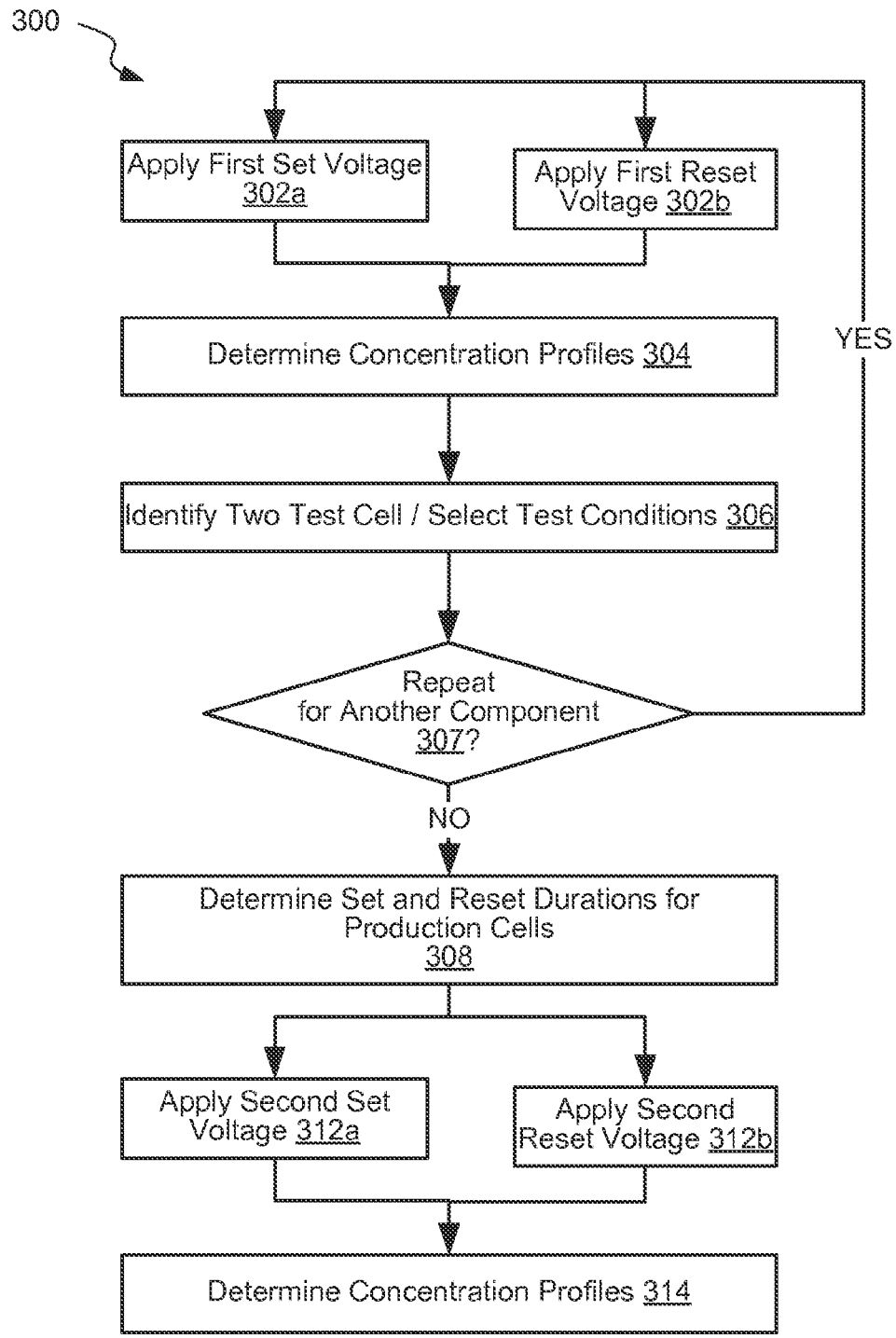
FIG. 3 illustrates a process flowchart corresponding to a method for determining switching conditions of a production memory cell, in accordance with some embodiments.

FIG. 3 is a process flowchart corresponding to method 300 for determining switching conditions of a production memory cell, in accordance with some embodiments. Method 300 may involve two groups of test cells. One of these groups is tested using set voltage (i.e., the set group) and the other group tested using reset voltage (i.e., the rest group). In various parts of this disclosure, the set group may be referred to as a first plurality of test cells, while the rest group may be referred to as a second plurality of test cells, at least for an initial round of testing, at least during the initial testing (e.g., operations 302a, 302b, 304, and 306 in FIG. 3) In some embodiments, additional set group and reset group may be used for further testing (e.g., operations 312a, 312n, and 314 in FIG. 3), which may be referred to as a third plurality of test cells and a fourth plurality of test cells, respectively.

Figure 5:
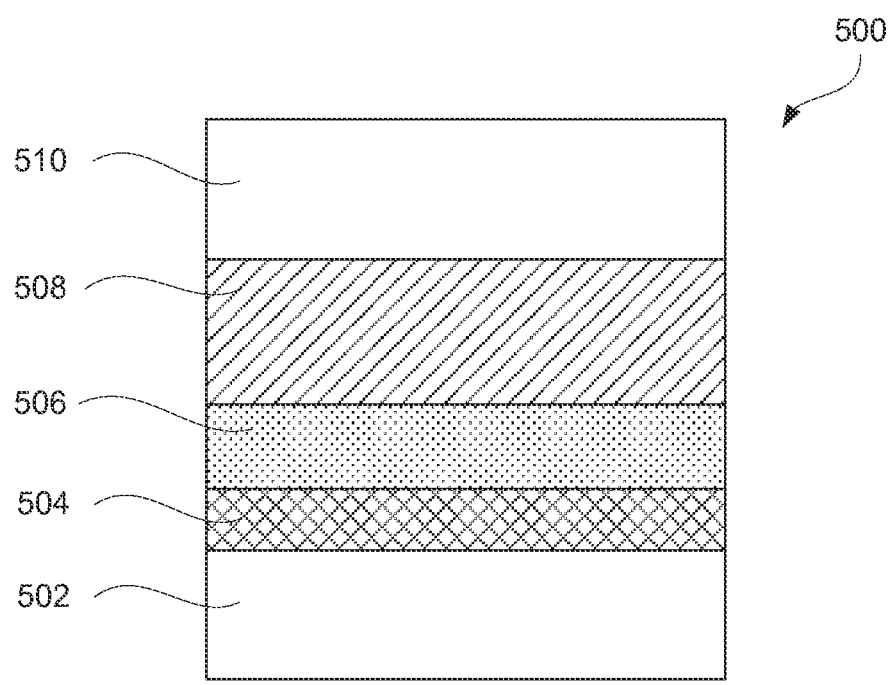
FIG. 5 illustrates a schematic representation of a test ReRAM cell, in accordance with some embodiments.

Test cells used for method 300 may be the same as production resistive switching cells as further described below with reference to FIG. 5. When two or more dopant containing components are used in the same production cell, two or more test cells may be used to independently test effects of set and reset voltages on these components. As such various operations of method 300 may be repeated for additional components as shown by decision block 307 in FIG. 3.

Method 300 involves applying a set voltage to each test memory cell of a set group during operation 302a. Because this operation may be repeated one or more times using different set voltages, the set voltage applied during the first instance of operation 302a may be referred to as a first set voltage. The duration of the set voltage application may be different for each test memory cell in the set group. One having ordinary skills in the art would understand that a sub-group including multiple cells (rather than a single cell) may be used for each set voltage application duration to consider testing repeatability.

All durations used during operation 302a may be substantially longer than duration of a set operation used for a production cell. In some embodiments, a ratio of the average duration using during operation 302a to the duration of the production cell set operation is between about $10^2$ and $10^6$. The duration for each test cell may be varied combinatorially. In some embodiments, a ratio of the longest duration to the shortest duration used during operation 302a is between about 10 and $10^2$. This variation allows determining duration effects on dopant diffusion within the test cells.

The set voltage applied to all cells in the set group during operation 302a may be the same and may be representative of a typical set voltage used for a production cell.

Method 300 also involves applying a reset voltage to each test memory cell of a reset group during operation 302b. Operation 302b may be performed independently from operation 302a, e.g., performed before, after, or at the same time. Because operation 302b may be repeated one or more times using different reset voltages, the reset voltage applied during the first instance of operation 302b may be referred to as a first reset voltage. The duration of the reset voltage application may be different for each test memory cell in the reset group. One having ordinary skills in the art would understand that a sub-group including multiple cells (rather than a single cell) may be used for each reset voltage application duration to consider testing repeatability.

All durations used during operation 302b may be substantially longer than duration of a reset operation used for a production cell. In some embodiments, a ratio of the average duration using during operation 302b to the duration of the production cell reset operation is between about $10^2$ and $10^6$. In some embodiments, the same ratios are used for operations 302a and 302b. The duration for each test cell during operation 302b may be varied combinatorially. In some embodiments, a ratio of the longest duration to the shortest duration used during operation 302b is between about 10 and $10^2$. This variation allows determining duration effects during operation 302b on dopant diffusion within the test cells.

The reset voltage applied to all cells in the set group during operation 302b may be the same and may be representative of a typical set voltage used for a production cell.

Because longer durations are used during operations 302a and 302b then during actual operation of a production cell, the test cells may excessively heat during these operations. Heating of a dopant containing component may impact the diffusion characteristics. In some embodiments, this heating may be used for accelerated testing. Alternatively, the temperature during one of or both operations 302a and 302b may be controlled to correspond to an operating temperature of a production memory cell. For example, the entire test cell may be cooled externally by positioning a substrate containing these cells on a cooling substrate support. In some embodiments, the design of test cells may incorporate one or more heat dissipating components that help to transfer the heat away from the dopant containing component. Furthermore, a test cell may include a cooling component, such as a Peltier device that provides thermoelectric cooling. The orientation of the Peltier device for set and reset group of cells to ensure cooling of the same dopant containing component despite using set and reset voltages having opposite polarities.

After completing operations 302a and 302b, method 300 may proceed with determining a dopant concentration profile of each dopant containing component during operation 304. The dopant containing component may be referred to a test component. When multiple dopant containing components are present in the same production cells, these components may be tested together in the same test or separately in different test. The dopant concentration profile is determined for each cell in the set group and reset group.

Figure 4:
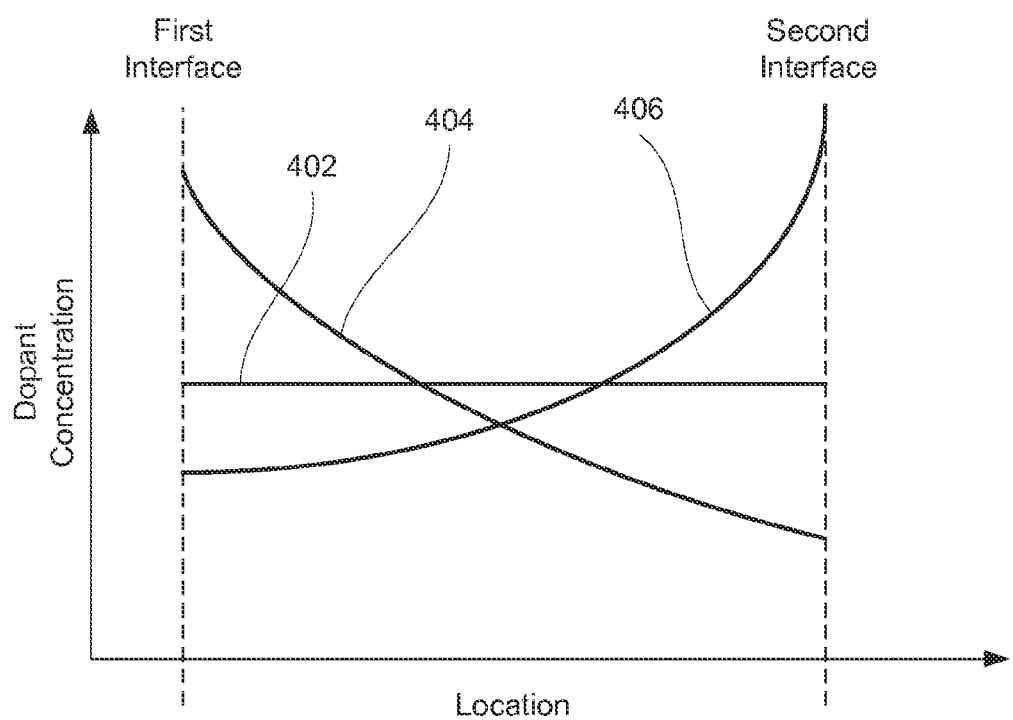
FIG. 4 illustrates schematic examples of dopant distribution profiles prior to applying any voltages, after applying a set voltage, and after applying a reset voltage, in accordance with some embodiments.

Examples of dopant concentration profiles are presented in FIG. 4. Specifically, line 402 represents a dopant concentration profile in a dopant containing component prior to performing operation 302a or operation 302b. In this example, the dopant containing component has a uniform distribution of the dopant throughout its thickness before its first and second interface shown with dashed lines. In some embodiments, the initial distribution of dopant may be non-uniform. For example, the dopant concentration may gradually or in stepped fashion increase from one interface to the other interface. Line 404 represents a dopant concentration profile in the same kind dopant containing component after performing operation 302a. When comparing lines 402 and 404, one can see that the dopant has been shifted more towards the first interface. Line 406 represents a dopant concentration profile in the same kind dopant containing component after performing operation 302b. In this case, the dopant has been shifted more towards the second interface because the polarity of used during operation 302a is opposite to the polarity used during operation 302b.

Method 300 may proceed with identifying one memory cell in the set group and one memory cell in the second group during operation 306. The identified memory cell may have the complementary changes in the dopant concentration profile. For example, the equivalence may be established when two profiles are substantially mirror images of each other, or when the position of some characteristic feature of the dopant profile (such as the dopant concentration minimum, maximum, or the maximum of the absolute value of the usual or logarithmic derivative of concentration with the coordinate) is changed by the same distance in the opposite directions. Operation 306 may also involve selecting the first duration used for the first memory cell and the second duration used for the second memory cell.

Operations 302a, 302b, 304, and 306 may be repeated different components to find switching conditions that are acceptable for multiple components. Different severity factors may be assigned to different components depending on impact of dopant diffusion in the components on the overall performance of the cell.

One cell identified during operation 306 has corresponding set voltage application duration, while the other identified cell has corresponding reset voltage application duration. These durations may be the same or different. These duration values may be used during operation 308 to determine set and reset durations for production cells. For example, the duration values for the cells identified during operation 306 may be scaled down by the same factor. In some embodiments, the ratio of the set operation duration for the identified test cell and selected set operation duration for production cells is between about $10^2$ and $10^6$. In the same or other embodiments, the ratio of the reset operation duration for the identified test cell and selected reset operation duration for production cells is between about $10^2$ and $10^6$. Both ratios may be substantially the same.

In some embodiments, operation 306 may involve applying a statistical analysis. Specifically, the statistical analysis may be used to determine a set duration for the production memory cell from a first duration used to apply the first set voltage to the first test memory cell and an additional first duration used to apply the first set voltage to the additional first test memory cell. In some embodiments, the statistical analysis to determine the reset duration for the production memory cell from a second duration used to apply the first reset voltage to the second test memory cell and an additional second duration used to apply the first reset voltage to the additional second test memory cell. In some embodiments, the same type of statistical analysis may be used for determining both set and reset durations. One having ordinary skills in the art would understand various statistical techniques that can be used for such analysis, such as correlation, and regression.

In some embodiments, method 300 may involve applying a second set voltage to another group of test memory cells during operation 312a and applying a second reset voltage to yet another group of test memory cells during operation 312b. Operations 312a and 312b may be followed by determining concentration profiles in both of these groups of cells during operation 314. In some embodiments, operations 312a and 312b are performed on the same group of test cells to determine combined effects of set and reset operations. Overall, operations 312a, 312b, and 314 may be used for validating parameters identified during operation 308. The second set voltage may be the same as the set voltage used during operation 302a. The second reset voltage may be the same as the reset voltage used during operation 302b. Alternatively, one or both of second set and reset voltages may be different than voltages used during operations 302a and 302b.

In some embodiments, all cells tested during operation 312a are subjected to the second set voltage for the same duration. Likewise, all cells tested during operation 312b may be subjected to the second reset voltage for the same duration. These durations may be representative (e.g., scaled) of the values determined during operation 308.

Examples of ReRAM Cells

In some embodiments, a production memory cell is equivalent to each test memory cell used for test methods described above with reference to FIG. 3. Specifically, the production cell may include all of the same components and these components may be arranged in the same manner as in each test memory cell of the set group and of the reset group. For example, a set of components including a dopant containing component and two components directly interfacing the dopant containing component may be same in the production memory cell and each test memory cell. Alternatively, at least one component of a production memory cell may be different than in test memory cells. For examples, test memory cells may be modified to eliminate or, on the other hand, enhance effects of other components during testing.

Various examples of a production memory cell will now be described with reference to FIG. 5. Possible variations that yield test cells will be also described. FIG. 5 illustrates a schematic representation of a ReRAM cell 500, in accordance with some embodiments. ReRAM cell 500 may include first electrode 502, embedded resistor 504, current steering element 506, resistive switching layer 508, and second electrode 510. The "first" and "second" terminology is used herein only for differentiating reasons and does not imply any deposition order or spatial orientation of the layers unless specifically noted. Any of first electrode 502, embedded resistor 504, current steering element 506, resistive switching layer 508, and second electrode 510 may be a dopant containing element as further described below. In general, other possible dopant containing components, such as signal lines, external transistors, and the like, do not have significant impact on performance of ReRAM cell 500 and are omitted from the following description. In some embodiments, ReRAM cell 500 has more or fewer layers, in both product and test cells. For example, ReRAM cell 500 may have work function layer, diffusion barrier layers, and other layers disposed between two electrodes 502 and 510.

Electrodes 502 and 510 may be fabricated from a conductive material that has a desirable conductivity, such as p-type polysilicon, n-type polysilicon, transition metals, transition metal alloys, transition metal nitrides, or transition metal carbides. For example, electrode 310 may include one or more of titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), or ruthenium (Ru). Electrode 310 may include titanium/aluminum alloy and/or a silicon-doped aluminum. Electrodes 302 and 310 may be between about 5 nm and about 500 nm thick or, more specifically, between about 10 nm and about 100 nm thick.

Embedded resistor 504 may be interconnected in series with resistive switching layer 508. Embedded resistor 504 may include a metal silicon nitride, such as tantalum silicon nitride, titanium silicon nitride, and tantalum silicon nitride. Embedded resistor 504 is configured to maintain its resistance substantially constant (e.g., changing by less than 50%) when a switching signal is applied to ReRAM cell 500 and when resistive switching layer 508 changes its resistive state.

Current steering element 506 may be an intervening electrical component, such as a p-n junction diode, p-i-n diode, transistor, or other similar device disposed between first electrode 502 and second electrode 510. As such, current steering element 506 may be connected in series with resistive switching layer 508. In some embodiments, current steering element 506 may include two or more layers of semiconductor materials, such as two or more doped silicon layers, that are configured to direct the flow of current through the device. Current steering element 506 may be a diode that includes a p-doped silicon layer, an un-doped intrinsic layer, and an n-doped silicon layer.

Resistive switching layer 508 may be formed from one or more of the following materials: chalcogenides, carbon polymers, perovskites, metal oxides and metal nitrides. Some examples of suitable metal oxides include nickel oxide, niobium oxide, titanium oxide, hafnium oxide, aluminum oxide, tantalum oxide, zirconium oxide, yttrium oxide, scandium oxide, magnesium oxide, chromium oxide, and vanadium oxide. Examples of nitrides include boron nitride and aluminum nitride. In some embodiments, metal oxides with a bandgap greater than 3 eV may be used. Some of examples such oxides include hafnium oxide, aluminum oxide, tantalum oxide, zirconium oxide, and yttrium oxide. In some embodiments, the thickness of resistive switching layer 508 is between about 10 Angstroms and 500 Angstroms or, more specifically, between about 50 Angstroms and 200 Angstroms.

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for determining switching conditions of a production memory cell, the method comprising:
    applying a first set voltage to each test memory cell of a first plurality of test memory cells,
        wherein the first set voltage is applied for a different first duration to each test memory cell of the first plurality of test memory cells than any other test memory cell of the first plurality of test memory cells;
    applying a first reset voltage to each test memory cell of a second plurality of test memory cells,
        wherein the first reset voltage is applied for a different second duration to each test memory cell of the second plurality of test memory cells than any other test memory cell of the second plurality of test memory cells, and
        wherein the first set voltage and the first reset voltage have opposite polarities;
    after applying the first set voltage and applying the first reset voltage, determining a dopant concentration profile of a first test component in each test memory cell of the first plurality of test memory cells and each test memory cell of the second plurality of test memory cells;
    identifying a first test memory cell of the first plurality of test memory cells and a second test memory cell of the second plurality of test memory cells such that the changes in the dopant concentration profile of the first test component of the first test memory cell is complementary to the changes in the dopant concentration profile of the first test component of the second test memory cell; and
    selecting the first duration used for the first memory cell and the second duration used for the second memory cell.

2. The method of claim 1, wherein the production memory cell is equivalent to each test memory cell of the first plurality of test memory cells and of the second plurality of test memory cells.

3. The method of claim 1, wherein at least one component of the production memory cell is different than in each test memory cell of the first plurality of test memory cells and of the second plurality of test memory cells.

4. The method of claim 1, wherein a set comprising the first test component and two components directly interfacing the first test component is same in the production memory cell and each test memory cell of the first plurality of test memory cells and of the second plurality of test memory cells.

5. The method of claim 1, wherein the first test component in each test memory cell of the first plurality of test memory cells and the second plurality of test memory cells is one of a current steering element, a resistive switching layer, or an embedded resistor.

6. The method of claim 1, wherein the first set voltage is applied to the first test memory cell for a first duration, wherein the first reset voltage is applied to the second test memory cell for a second duration, and wherein the first duration is different than the second duration.

7. The method of claim 1, wherein an absolute value of the first set voltage is different than an absolute value of the first reset voltage.

8. The method of claim 1, further comprising determining a set duration for the production memory cell from a first duration used to apply the first set voltage to the first test memory cell and determining a reset duration for the production memory cell from a second duration used to apply the first reset voltage to the second test memory cell.

9. The method of claim 8, wherein a ratio of the first duration to the set duration is between about $10^2$ and $10^6$, and wherein a ratio of the second duration to the reset duration is between about $10^2$ and $10^6$.

10. The method of claim 9, wherein the ratio of the first duration to the set duration is equal to the ratio of the second duration to the reset duration.

11. The method of claim 1, further comprising:
    applying a second set voltage to each test memory cell of a third plurality of test memory cells for a first duration used to apply the first set voltage to the first test memory cell;
    applying a second reset voltage to each test memory cell of a fourth plurality of test memory cells for a second duration used to apply the first reset voltage to the second test memory cell; and
    after applying the second set voltage to the third plurality of test memory cells and applying the second reset voltage to the fourth plurality of test memory cells, determining a dopant concentration profile of the first test component in each test memory cell of the third plurality of test memory cells and each test memory cell of the fourth plurality of test memory cells.

12. The method of claim 11, wherein the second set voltage is equal to the first set voltage, and wherein the second reset voltage is equal to the first reset voltage.

13. The method of claim 11, wherein the second set voltage is different than the first set voltage, and wherein the second reset voltage is different than the first reset voltage.

14. The method of claim 13, wherein a ratio of the second set voltage to the first set voltage is equal to a ratio of the second reset voltage to the first reset voltage.

15. The method of claim 11, wherein a ratio of the second set voltage to the first set voltage is different than a ratio of the second reset voltage to the first reset voltage.

16. The method of claim 1, further comprising:
    after applying the first set voltage and applying the first reset voltage, determining a dopant concentration profile of a second test component in each test memory cell of the first plurality of test memory cells and each test memory cell of the second plurality of test memory cells; and
    identifying an additional first test memory cell of the first plurality of test memory cells and an additional second test memory cell of the second plurality of test memory cells such that the change in the dopant concentration profile of the second test component of the additional first test memory cell is complementary to the change in the dopant concentration profile of the second test component of the additional second test memory cell.

17. The method of claim 16, further comprising:
applying a statistical analysis to determine a set duration for the production memory cell from a first duration used to apply the first set voltage to the first test memory cell and an additional first duration used to apply the first set voltage to the additional first test memory cell; and
applying a statistical analysis to determine a reset duration for the production memory cell from a second duration used to apply the first reset voltage to the second test memory cell and an additional second duration used to apply the first reset voltage to the additional second test memory cell.

18. The method of claim 1, wherein each test memory cell of the first plurality of test memory cells is cooled while applying the first set voltage.

19. The method of claim 1, wherein the dopant concentration profile represents a single dopant.

20. The method of claim 1, wherein the dopant concentration profile represents multiple dopants.

\* \* \* \* \*